(12) United States Patent
Zhang et al.

(10) Patent No.: US 7,688,656 B2
(45) Date of Patent: Mar. 30, 2010

(54) INTEGRATED CIRCUIT MEMORY HAVING DYNAMICALLY ADJUSTABLE READ MARGIN AND METHOD THEREFOR

(75) Inventors: Shayan Zhang, Austin, TX (US); Hema Ramamurthy, Austin, TX (US); Zheng Xu, Austin, TX (US); Michael D. Snyder, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 191 days.

(21) Appl. No.: 11/875,997

(22) Filed: Oct. 22, 2007

(65) Prior Publication Data

US 2009/0103379 A1  Apr. 23, 2009

(51) Int. Cl.
G11C 29/00  (2006.01)
(52) U.S. Cl. .................. 365/200; 365/205; 365/207
(58) Field of Classification Search .............. 365/200, 365/205, 207
See application file for complete search history.

(56) References Cited

U.S. PATENT DOCUMENTS

| | | | |
|---|---|---|---|
| 5,420,798 A | 5/1995 | Lin et al. | |
| 5,436,513 A | 7/1995 | Kaye et al. | |
| 5,801,985 A | 9/1998 | Roohparvar et al. | |
| 5,875,135 A * | 2/1999 | Patwardhan et al. | 365/194 |
| 6,128,236 A * | 10/2000 | Faue et al. | 365/207 |
| 6,462,998 B1 * | 10/2002 | Proebsting | 365/205 |
| 6,522,161 B2 | 2/2003 | Lunde et al. | |
| 6,552,357 B2 | 4/2003 | Akita | |
| 6,597,620 B1 | 7/2003 | McMinn | |
| 6,628,552 B1 | 9/2003 | Larsen et al. | |
| 6,724,648 B2 | 4/2004 | Khellah et al. | |
| 6,738,292 B2 | 5/2004 | Shioyama | |
| 6,781,904 B2 | 8/2004 | Lee et al. | |
| 6,807,101 B2 | 10/2004 | Ooishi et al. | |
| 6,809,538 B1 | 10/2004 | Borkar | |
| 6,980,476 B2 | 12/2005 | Do | |
| 7,042,776 B2 | 5/2006 | Canada et al. | |
| 7,126,868 B2 | 10/2006 | Mizuno et al. | |
| 7,158,432 B1 * | 1/2007 | Hunter et al. | 365/207 |
| 7,292,495 B1 | 11/2007 | Kenkare et al. | |
| 7,542,369 B2 | 6/2009 | Kenkare et al. | |

(Continued)

OTHER PUBLICATIONS

Zhang, et al., "3-GHz 70-Mb SRAM in 65-nm CMOS Technology With Integrated Column-Based Dynamic Power Supply," IEEE Journal of Solid-State Circuits, vol. 41, No. 1, Jan. 2006, pp. 146-151.

(Continued)

*Primary Examiner*—Tuan T Nguyen
*Assistant Examiner*—Hien N Nguyen
(74) *Attorney, Agent, or Firm*—Daniel D. Hill; Ranjeev Singh

(57) ABSTRACT

A method for dynamically controlling sense amplifier differential margin of a memory during operation, in an integrated circuit, including a plurality of addressable units, is provided. The method includes setting the sense amplifier differential margin corresponding to the plurality of addressable units to a first value. The method further includes if a read data error occurs when data is read from a set of the plurality of addressable units, then setting the sense amplifier differential margin corresponding to the plurality of addressable units to a second value, wherein the second value is greater than the first value.

21 Claims, 6 Drawing Sheets

U.S. PATENT DOCUMENTS

| | | |
|---|---|---|
| 2004/0025065 A1 | 2/2004 | Lou |
| 2004/0130930 A1 | 7/2004 | Houston |
| 2005/0024917 A1 | 2/2005 | Yamaoka et al. |
| 2005/0132238 A1 | 6/2005 | Nanja |
| 2005/0286193 A1 | 12/2005 | Alokby |
| 2006/0018160 A1 | 1/2006 | Moogat et al. |
| 2006/0039182 A1 | 2/2006 | Sakurai et al. |
| 2006/0052958 A1 | 3/2006 | Hancock et al. |
| 2006/0056229 A1 | 3/2006 | Maeda et al. |
| 2006/0128348 A1 | 6/2006 | Jang |
| 2007/0047358 A1 | 3/2007 | Oh |
| 2008/0091990 A1 | 4/2008 | Bruce et al. |

OTHER PUBLICATIONS

International Search Report and Written Opinion correlating to PCT/US2008/076512 Dated Mar. 31, 2009.

\* cited by examiner

INTEGRATED CIRCUIT MEMORY HAVING DYNAMICALLY ADJUSTABLE READ MARGIN AND METHOD THEREFOR

RELATED APPLICATION

The present application is related to a commonly assigned, co-pending application by Magnus et al. entitled, "Controlled Reliability in an Integrated Circuit", having U.S. patent application Ser. No. 11/536,342, and filed on Sep. 28, 2006.

BACKGROUND

1. Field

This disclosure relates generally to integrated circuits, and more specifically, to an integrated circuit memory having dynamically adjustable read margin and method therefor.

2. Related Art

Reducing power consumption is a continuing desire in integrated circuits. One way of reducing power consumption is by reducing the power supply voltage. However, there is a limit on how low the power supply voltage can be reduced for reliable operation for a given circuit. A static random access memory (SRAM) is a type of memory that is generally used in applications requiring high speed, such as a memory in a data processing system. An SRAM cell is only stable in one of two possible voltage levels and is read by sensing a relatively low differential voltage on a pair of bit lines. A sense amplifier is used to sense and amplify the differential voltage. The sense amplifier is expected to be able to operate reliably over a wide voltage range, and yet be fast enough so that the performance advantage of the SRAM is maintained. However, the sense margin of the sense amplifier is reduced as the power supply voltage is reduced.

Therefore, there is a need for a reliable memory with good performance over a wide range of power supply voltage levels.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
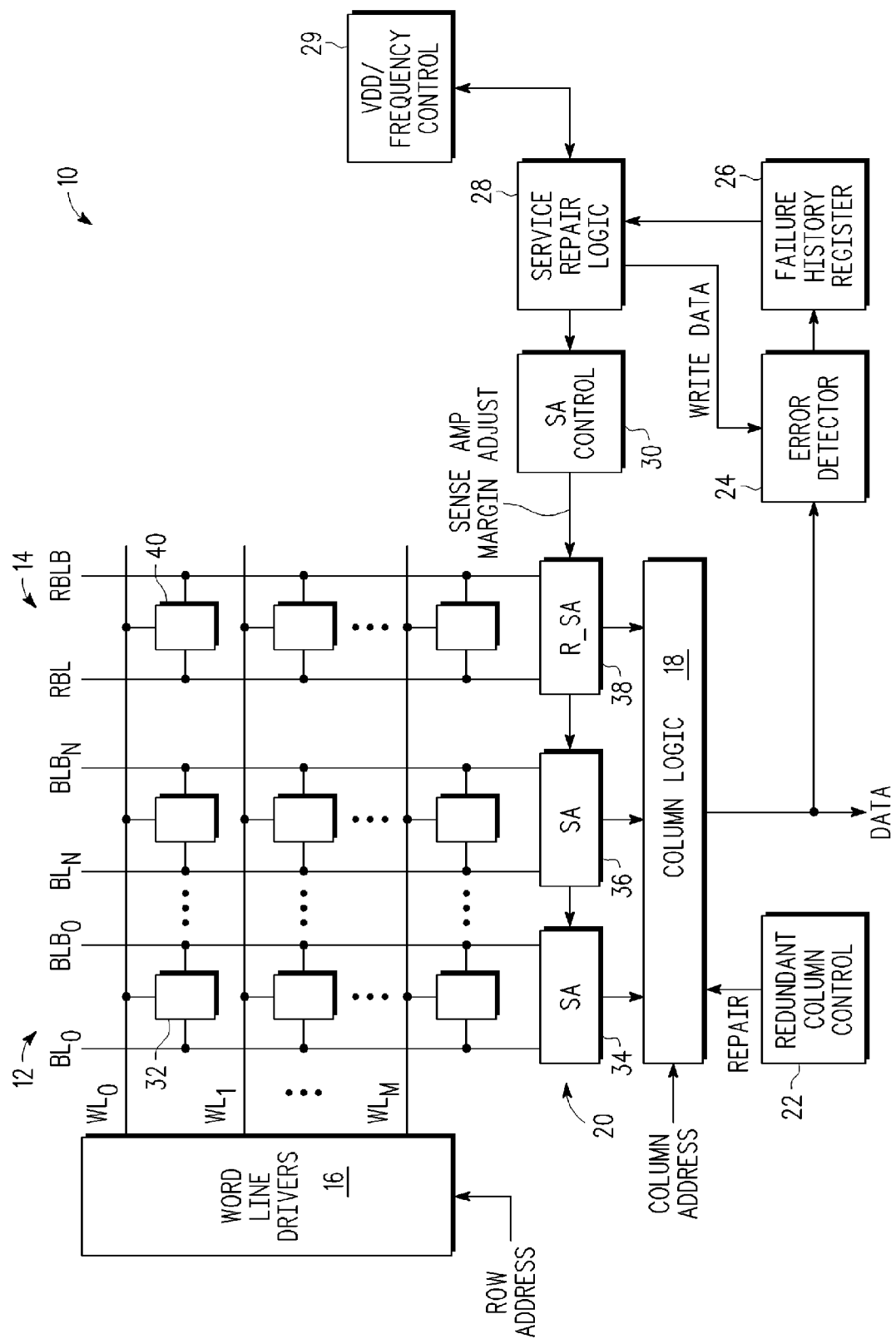
FIG. 1 illustrates, in block diagram form, an integrated circuit memory in accordance with an embodiment.

Generally, there is provided in one form, an integrated circuit memory having redundancy and a method for operating, where a feedback path having an error detector and service repair logic is used to correct for read errors in bit cells by first increasing a sense margin of the sense amplifiers. The read errors may be caused by timing errors where the sense time is too short or the sense amplifier margin is too small. The sense margin is increased by increasing a sense amplifier enable assertion time. If the increased sense margin does not correct the timing errors, then a redundant column is used to replace the defective column. This reduces the number of redundant columns on an integrated circuit memory and can improve manufacturing yields. In another embodiment, the feedback path includes a pair of shadow columns of memory cells. The shadow columns represent a "worst case" operating environment for the memory and have weakened shadow sense amplifiers that have basically the same failure mode. A feedback error signal adjusts the sense margins of the actual sense amplifiers based on predicted sense margins using the weakened sense amplifiers. In another embodiment, the results of the sense amplifier margin adjustment are used to sort integrated circuit memories based on performance.

In one aspect, there is provided, a method for dynamically controlling a sense amplifier differential margin of a memory during operation, in an integrated circuit, comprising a plurality of addressable units, the method comprising: setting the sense amplifier differential margin corresponding to the plurality of addressable units to a first value; and if a read data error occurs when data is read from a set of the plurality of addressable units, then setting the sense amplifier differential margin corresponding to the plurality of addressable units to a second value, wherein the second value is higher than the first value.

In another aspect, there is provided, a method for dynamically controlling a sense amplifier differential margin of a memory, in an integrated circuit, comprising a plurality of addressable units, the plurality of addressable units comprising at least one failure prediction addressable unit, wherein the failure prediction addressable unit is configured to fail before the remaining plurality of addressable units, the method comprising: setting the sense amplifier differential margin corresponding to the plurality of addressable units and the at least one failure prediction addressable unit to a first value; and if a read data error occurs when data is read from the failure prediction addressable unit, then setting the sense amplifier differential margin corresponding to the plurality of addressable units to a second value, wherein the second value is greater than the first value.

In yet another aspect, there is provided, a method for dynamically controlling sense amplifier differential margin of a memory, in an integrated circuit, comprising a plurality of addressable units and at least one redundant addressable unit, the method comprising: setting the sense amplifier differential margin corresponding to the plurality of addressable units and the at least one redundant addressable unit to a first value; and if a read data error occurs when data is read from any one of the plurality of addressable units, then setting the sense amplifier differential margin corresponding to the plurality of addressable units and the at least one redundant addressable unit to a second value, wherein the second value is greater than the first value; incrementally increasing the sense amplifier differential margin to a maximum value if a read data error continues to occur for any one of the plurality of addressable units; and substituting the redundant addressable unit in place of a defective addressable unit, wherein the defective addressable unit is one of the plurality of addressable units that generates a read data error even when the sense amplifier differential margin is set to the maximum value.

In yet another aspect, there is provided, an integrated circuit comprising a memory, wherein the memory comprises a plurality of addressable units, the memory further comprising: a memory array coupled to a plurality of sense amplifiers; and a feedback path configured for: setting a sense amplifier differential margin for the plurality of sense amplifiers to a first value, detecting a read data error when data is read from at least one of the plurality of addressable units, and setting the sense amplifier differential margin for the plurality of addressable units to a second value, wherein the second value is greater than the first value.

FIG. 1 illustrates, in block diagram form, an integrated circuit memory 10 in accordance with an embodiment. Integrated circuit memory 10 includes memory array 12, redundant column 14, word line drivers 16, column logic 18, sense amplifiers 20, redundant column control 22, error detector 24, failure history register 26, service repair logic 28, and sense amplifier control 30. Sense amplifiers 20 includes sense amplifiers 34 and 36 and redundant sense amplifier 38. In the illustrated embodiment, memory array 12 includes a plurality of SRAM cells organized in rows and columns. A row of memory cells includes a word line and all of the cells coupled to the word line. A column of memory cells includes a bit line pair and all of the cells coupled to the bit line pair. For example, a word line labeled "WL0" is coupled to a plurality of memory cells including a representative memory cell 32. Likewise, a column includes, for example, a bit line pair labeled "BL0" and "BLB0" is coupled to a plurality of memory cells including memory cell 32. In the illustrated embodiment, each of the bit line pairs is coupled to a sense amplifier for sensing a relatively small differential signal. For example, bit line pair BL0 and BLB0 is coupled to sense amplifier 34 and bit line pair BLN and BLBN is coupled to sense amplifier 36. Word line drivers 16 has a plurality of input terminals for receiving a row address labeled "ROW ADDRESS", and in response provides a word line voltage to one of the word lines WL0 to WLM, where M is an integer. Column logic 18 has a plurality of input terminals for receiving a column address labeled "COLUMN ADDRESS", and in response, couples one or more memory cells to provide data bits to sense amplifiers 20 via selected ones of bit line pairs BL0/BLB0 to BLN/BLBN. Column logic 18 has an output for providing data labeled "DATA". Memory array 12 includes one or more redundant columns represented by redundant column 14. Redundant column 14 is generally the same as a normal column and includes memory cells, such as memory cell 40 coupled to a redundant bit line pair RBL and RBLB. The bit line pair RBL and RBLB is coupled to a redundant sense amplifier 38. Redundant sense amplifier 38 may be larger and more reliable than a normal sense amplifier. A redundant column control circuit 22 is coupled to column logic 18 to control operation of redundant column 14. Redundant column control circuit 22 includes a storage mechanism, such as conventional fuses or non-volatile memory to store redundancy information such as addresses and output paths. The redundancy information is used to cause a redundant column to replace a defective column. FIG. 1 illustrates only a single redundant column for purposes of simplicity and clarity. However, typically, when a defective column is detected, the defective column is replaced as well as the adjacent column on each side of the defective column. Also, note that in the illustrated embodiment, a separate sense amplifier is coupled to each bit line pair. In other embodiments, a sense amplifier may be shared by several bit line pairs or redundant bit line pairs. Also, note that in other embodiments, row redundancy may be included.

An error feedback path includes error detector 24, failure history register 26, service repair logic 28 and sense amplifier control 30. Error detector 24 has an input coupled to the output of column logic 18 for receiving data signals DATA, and an output coupled to an input of failure history register 26. Service repair logic 28 has an input coupled to an output of failure history register 26, an input/output coupled to a power supply (VDD) and frequency control circuit 29, a first output for providing a write data signal labeled "WRITE DATA", and a second output. Power supply and frequency control circuit 29 controls the power supply voltage received by memory 10 and a clock frequency of a clock signal provided to control the timing of operations in memory 10. In another embodiment, error detector 24 may have another output coupled to service repair logic 28, thus bypassing failure history register 26. Sense amplifier control 30 has an input coupled to the output of service repair logic 28, and an output coupled to each of sense amplifiers 34, 36, and 38. Note that each of the arrows coupled between blocks in FIG. 1 may include one or more conductors for conducting control signals and voltages between blocks.

Service repair logic 28 includes a register for storing different sense amplifier margins. In response to error detector 24 detecting a timing error, service repair logic 28 will incrementally change the sense amplifier timing margin. For example, the margin may first be adjusted to 50 millivolts (mV). If the bits still fail on re-test with a 50 mV margin, then the margin may be adjusted to 70 mV and re-tested. The number of sense amplifier testing iterations may be any number. In one embodiment, the sense amplifier is tested at 50 mV, 70 mV, 90 mV, and 110 mV. In another embodiment, the margins and the number of test iterations may be different. Also, the sense amplifier margin may be adjusted by increasing the amount of time the sense amplifier has to detect and amplify the relatively small differential voltage from a selected bit line pair. For a given sense amplifier, a longer amount of time will allow the sense amplifier to separate the sensed differential voltage on a bit line pair by a greater margin. The power supply voltage and clock frequency provided by power supply and frequency control 29 can affect the sense amplifier margin as well. As will be discussed later in more detail, service repair logic 28 can also cause the power supply voltage and clock frequency to be changed during testing.

The operation of integrated circuit memory 10 will be discussed later in the discussion of FIG. 3 and FIG. 4.

Figure 2:
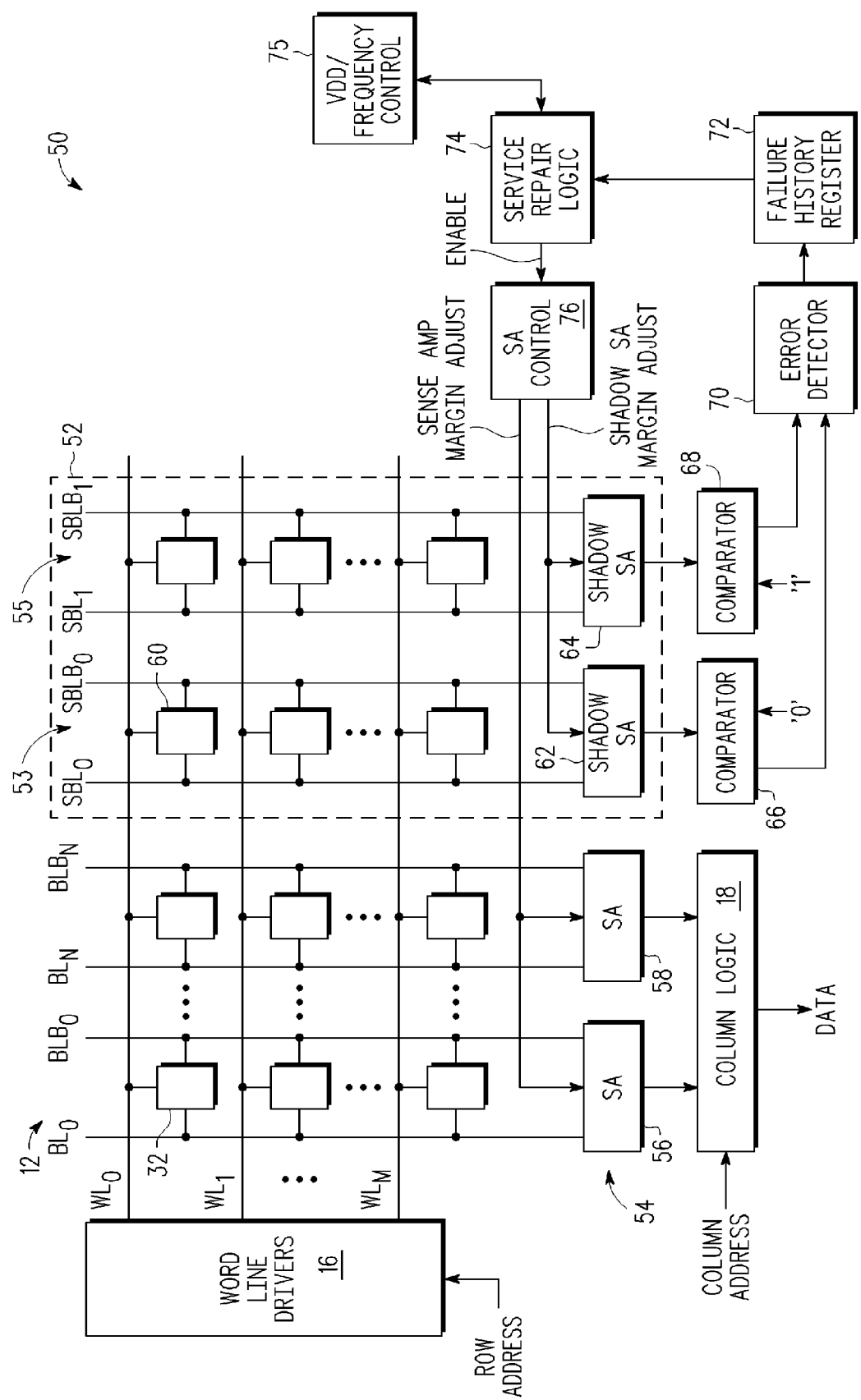
FIG. 2 illustrates, in block diagram form, an integrated circuit memory in accordance with another embodiment.

FIG. 2 illustrates, in block diagram form, an integrated circuit memory 50 in accordance with another embodiment. Integrated circuit memory 50 includes memory array 12, shadow columns 52, word line drivers 16, column logic 18, sense amplifiers 54, comparators 66 and 68, error detector 70, failure history register 72, service repair logic 74, and sense amplifier control 76. Sense amplifiers 54 includes sense amplifiers 56 and 58 and shadow sense amplifiers 62 and 64. As discussed above in the discussion of FIG. 1, memory array 12 includes a plurality of SRAM cells organized in rows and columns. A row of memory cells includes a word line and all of the cells coupled to the word line. A column of memory cells includes a bit line pair and all of the cells coupled to the bit line pair. For example, a word line labeled "WL0" is coupled to a plurality of memory cells including a representative memory cell 32. Likewise, a column includes, for example, a bit line pair labeled "BL0" and "BLB0" is coupled to a plurality of memory cells including memory cell 32. In the illustrated embodiment, each of the bit line pairs is coupled to a sense amplifier. For example, bit line pair BL0 and BLB0 is coupled to sense amplifier 56 and bit line pair BLN and BLBN is coupled to sense amplifier 58. Word line drivers 16 has a plurality of input terminals for receiving a row address labeled "ROW ADDRESS", and in response provides a word line voltage to one of the word lines WL0 to WLM, where M is an integer. Column logic 18 has a plurality of input terminals for receiving a column address labeled "COLUMN ADDRESS", and in response, couples one or more memory cells to provide data bits to sense amplifiers 54 via selected ones of bit line pairs BL0/BLB0 to BLN/BLBN. Column logic 18 has an output for providing data labeled "DATA". Memory array 12 includes shadow columns 52. Shadow columns 52 includes shadow columns 53 and 55. Shadow column 53 is generally the same as a normal column and includes a plurality of memory cells, such as memory cell 60 coupled to a bit line pair labeled "SBL0" and "SBLB0". Also, shadow column 55 includes a plurality of memory cells coupled to a bit line pair labeled "SBL1" and "SBLB1". The shadow bit line pair SBL0 and SBLB0 is coupled to a shadow sense amplifier 62 and the shadow bit line pair SBL1 and SBLB1 are coupled to a shadow sense amplifier 64. A comparator 66 has an input coupled to an output of shadow sense amplifier 62, an input for receiving a logic "0", and an output. Comparator 68 has an input coupled to an output of shadow sense amplifier 64, an input for receiving a logic "1", and an output. The outputs of comparators 66 and 68 are coupled to inputs of error detector 70. The shadow sense amplifiers 62 and 64 are implemented to be weaker than one of the normal sense amplifiers 54. Note that in the illustrated embodiment, a separate sense amplifier is coupled to each bit line pair. In other embodiments, a sense amplifier may be shared by several bit line pairs or redundant bit line pairs. Also, note that in other embodiments, row and column redundancy may be included.

An error feedback path includes error detector 70, failure history register 72, service repair logic 74 and sense amplifier control 76. Error detector 70 has an output coupled to an input of failure history register 72. Service repair logic 74 has an input coupled to an output of failure history register 72, an input/output coupled to a power supply (VDD) and frequency control circuit 75, and an output coupled to an input of sense amplifier control 30. Power supply and frequency control circuit 75 controls the power supply voltage received by memory 50 and a clock frequency of a clock signal provided to control the timing of operations in memory 50. In another embodiment, error detector 70 may have another output coupled to service repair logic 74, thus bypassing failure history register 72. Sense amplifier control 76 has an input signal labeled "ENABLE" coupled to the output of service repair logic 74, a first output coupled to each of sense amplifiers 56 and 58 for providing a signal labeled "SENSE AMP MARGIN ADJUST", and a second output coupled to each of shadow sense amplifiers 62 and 64 for providing a signal labeled SHADOW SENSE AMP MARGIN ADJUST.

Generally, the shadow columns 53 are enabled in response to enable signal ENABLE from sense amplifier control 76. Instead of using data from the normal sense amplifiers as discussed above regarding the embodiment of FIG. 1, memory 50 uses shadow sense amplifiers 62 and 64 to adjust the margins of the normal sense amplifiers 56 and 58. Shadow sense amplifiers are implemented to be weaker than the normal sense amplifiers.

The operating conditions under which the memory operates can change. For example, if the integrated circuit is operating in hot conditions, such as under the hood of an automobile the sense margin can change to cause timing errors. If an error is detected in the data read from shadow columns 52, then the margins of normal sense amplifiers 54 are increased incrementally. One column, such as shadow column 53 has all of its memory cells written with, for example, a logic "0", and the other shadow column 55 has all of its memory cells written with for example, a logic "1". Therefore, shadow column 53 will read out a logic "0" only and shadow column 55 reads out a "1" only. For each read of array 12 the shadow columns will be read. Shadow sense amplifiers 62 and 64 will sense and amplify the differential voltages for the shadow columns. The output of the shadow sense amplifiers are compared with a predetermined logic state, and the results of the comparisons provided to error detector 70. If an error is detected, the error detector 70 may update a failure history register 72. Also, error detector 70 will provide the error information to service repair logic 74. Service repair logic 74 will cause sense amplifier control 76 to increase the margin of the normal sense amplifiers. Also, when the margin of the normal sense amplifiers 56 and 58 is adjusted, the margin of the shadow sense amplifiers 62 and 64 will be adjusted in a similar way. Adjusting the margin of the shadow sense amplifiers when the normal sense amplifiers are adjusted is necessary to prevent the occurrence of false predicted failures even though the normal sense amplifiers have been adjusted.

Figure 3:
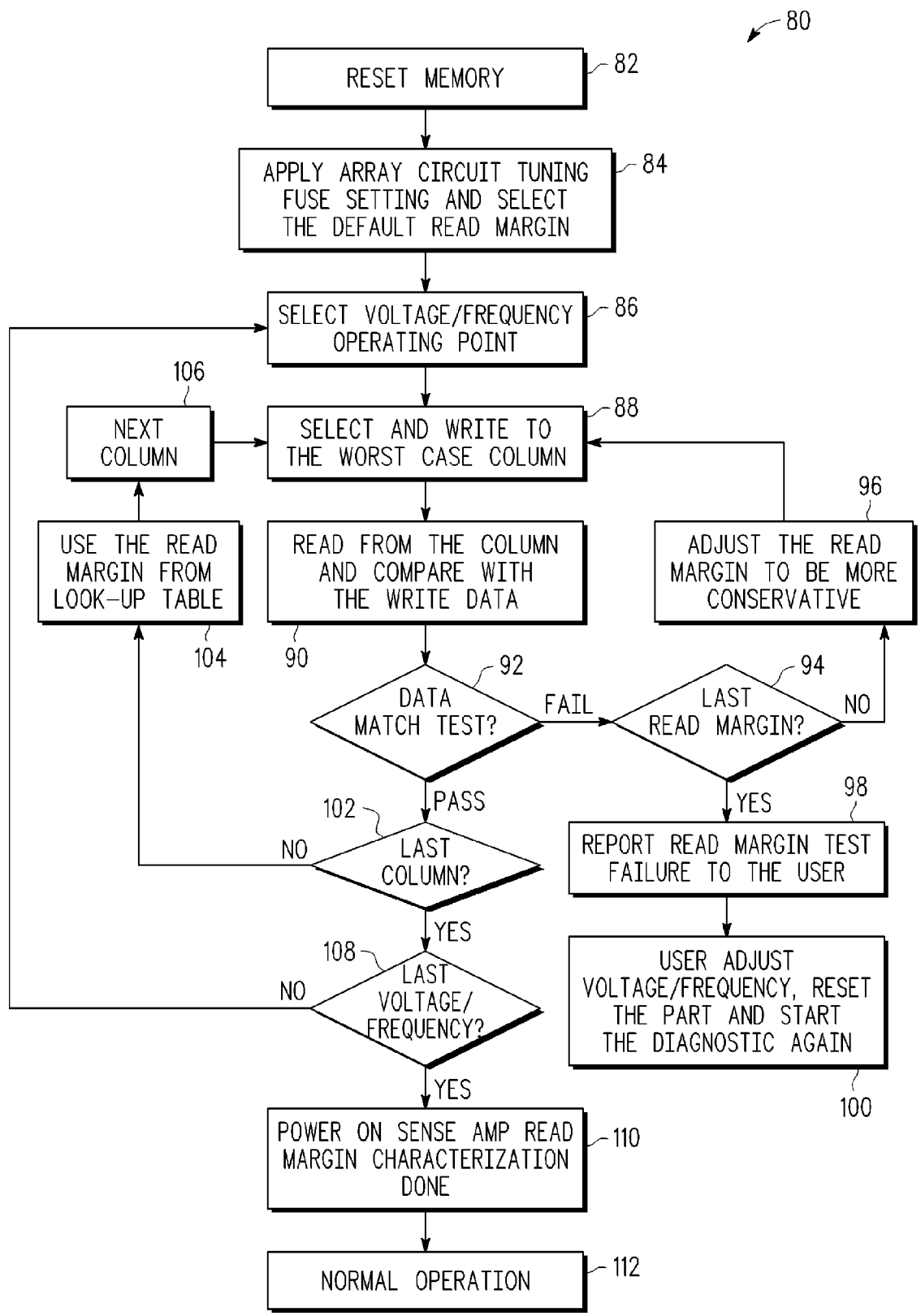
FIG. 3 illustrates a flow chart of a method for determining read margin in accordance with another embodiment.

FIG. 3 illustrates a flow chart of a method 80 for determining a read margin in accordance with another embodiment. The method will be discussed in connection with memory 10 of FIG. 1. The method begins at step 82. At step 82, the memory, such as memory 10, is powered up or reset. At step 84, array circuit tuning fuse settings are used to replace defective columns with redundant columns, if necessary. Also, a first read margin is chosen for sense amplifiers 34 and 36, and redundant sense amplifier 38. For example, the first read margin may be 50 mV. A table of available read margins may be stored in service repair logic 28 as discussed above. The default read margin is set by using a predetermined time period during which the sense amplifier is enabled during a read operation of the memory. The longer the sense amplifier is enabled, the wider the differential voltage margin sensed on the bit lines can be pulled. At step 86, a first power supply voltage and a first operating frequency are selected. The logic used to set the power supply voltage and operating frequency may be included in service repair logic 28, or in a different control circuit. At step 88, a worst case column of memory cells is selected and predetermined data is written to the column. The write data is also stored in service repair logic 28. A worst case column is a column that has been determined to provide the worst read margin. Commonly, the worst case column is determined to be a column along a perimeter of the memory array 12. At step 90, the column is then read from and compared with the write data WRITE DATA from service repair logic 28. At decision step 92, it is determined if the data read is the same as the data written to the column. If the read data does not match the write data, then there was a reading error. The reading error may be because a memory cell or bit line is defective, or because a sense amplifier is defective. If the memory fails at step 92, the FAIL path is taken to decision step 94. At decision step 94, it is determined if the last read margin of the read margin table stored in service repair logic 28 has been used. If the answer is no, then the NO path is taken to step 96, and the read margin is adjusted to be longer, or more conservative. The method then returns to step 88 and the worst case column is retested. Returning to step 94, the YES path is taken to step 98 if the widest margin has been used, indicating that the failure cannot be repaired by adjusting the sense amplifier margin at the current power supply voltage and frequency. The memory has failed and a report is generated and stored in the failure history register 26. At step 100, a different power supply voltage and operating frequency are chosen and method 80 is restarted at the beginning (step 84).

Returning to decision step 92, if the read data matches the write data, the memory passed the test at the current settings and the PASS path is taken to step 102. At decision step 102, it is determined if the last column has been tested. If the last column has been tested, then the YES path is taken to step 108. If another column is to be tested, then the NO path is taken to step 104 and the same read margin that the previously tested column passed is chosen from the look-up table of service repair logic 28. At step 106, the next column to be tested is selected and the method returns to step 86 with the next column. Returning again to step 108, if the last column has been tested and it is determined that the last power supply voltage and frequency have been used then the YES path is taken to step 110. At step 110, the read margin characterization tests are complete, and normal operation can proceed with the read margin, power supply voltage, and operating frequency as determined by the method 80. If, at step 108, other supply voltages and frequencies are to be tested, then the NO path is taken to back to step 86, and a new power supply voltage and operating frequency are selected. By testing a memory with different sense amplifier margins a memory, such as memory 10, can be rendered usable with an optimized read margin when the memory may not be usable otherwise.

Figure 4:
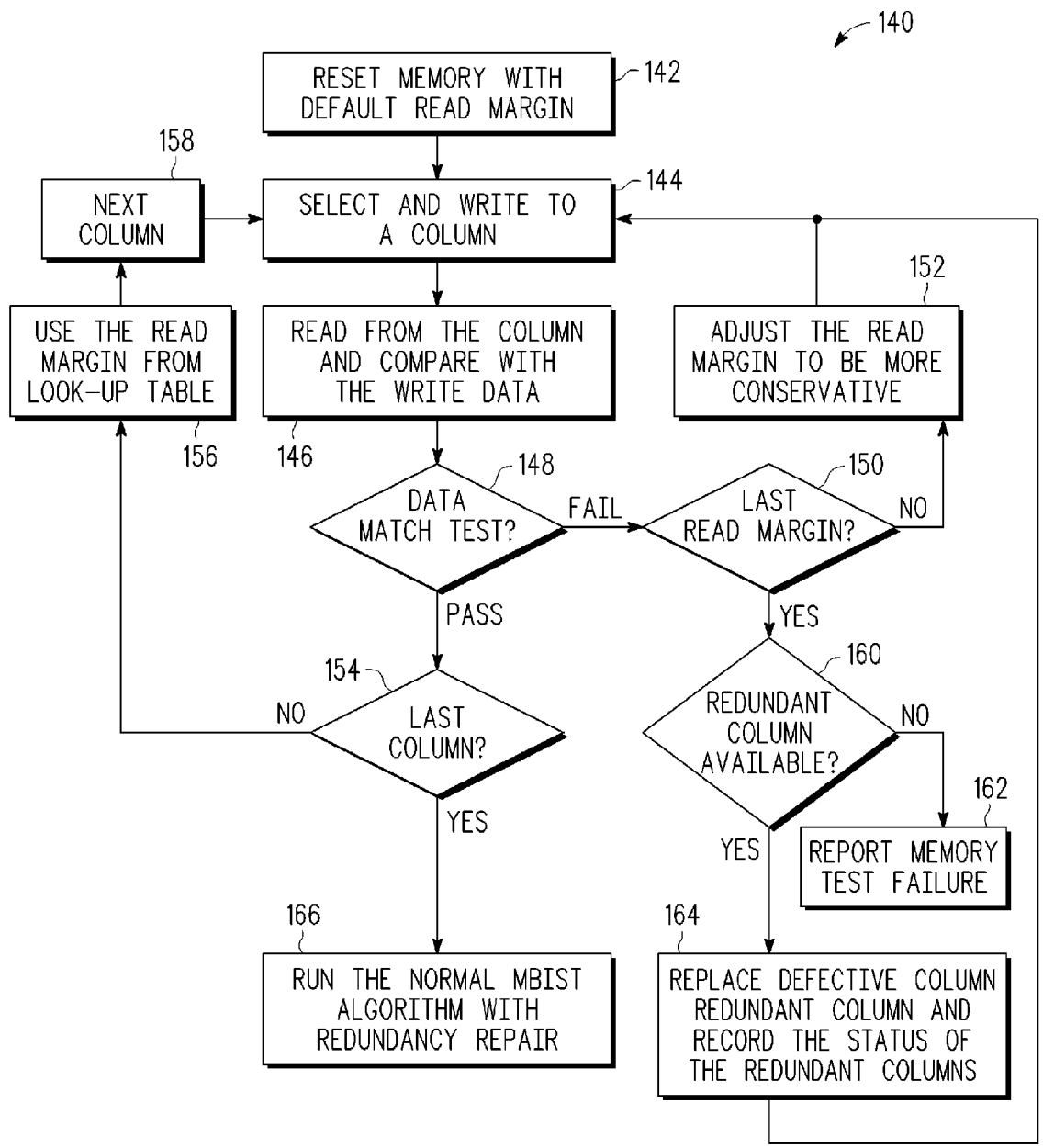
FIG. 4 illustrates a flow chart of a method for determining read margin in accordance with another embodiment.

FIG. 4 illustrates a flow chart of a method 140 for determining a read margin in memory 10 in accordance with another embodiment. The method begins at step 142 where memory 10 is reset with a default read margin from a look-up table in service repair logic 28. At step 144, a column of array 12 is selected and written to with predetermined test data. The predetermined test data is also stored in service repair logic 28. At step 146, the column is read and the read data is compared to the WRITE DATA as provided by service repair logic 28. At decision step 148, it is determined if the read data from the selected column matches the write data as stored in service repair logic 28. If the read data does not match the write data, then the FAIL path is taken to decision step 150. At decision step 150, it is determined if the current read margin is the most conservative, or largest, read margin in the look-up table of service repair logic 28. If more conservative read margins are available, then the NO path is taken to step 152 and the read margin is adjusted to be more conservative. The read margin is adjusted by increasing the amount of time the sense amplifier amplifies the read data. Increasing the read time allows the sense amplifier to pull the differential voltage wider. The method returns to step 144. However, if the most conservative read margin has been used, then the YES path is taken from decision step 150 to decision step 160. At decision step 160, it is determined whether or not all of the redundant columns have been used to replace defective columns. If there are no redundant columns available to repair the column, then the NO path is taken to step 162 where the test failure is recorded. But if a redundant column is available, then the YES path is taken to step 164 and a redundant column, such as redundant column 14, is used to replace the defective column. Note that in normal column redundancy, redundant columns are replaced in groups of three contiguous redundant columns. However, only one redundant column is illustrated in memory 10 of FIG. 3. The method then returns to step 144 and the steps following step 144 are repeated with the redundant column included. If at decision step 148, the read data matches the write data, the PASS path is taken to step 154. At decision step 154, it is determined if the last column has been tested. If there are additional columns to test, then the NO path it taken to step 156. At step 156, the read margin from the previous test is used. At step 158, the next column is selected. At step 144, the method continues as described above. If at decision step 154 it is determined that the last column has been tested, then the YES path is taken to step 166. At step 166, a conventional MBIST (memory built-in-self-test) algorithm with redundancy repair can be run.

Figure 5:
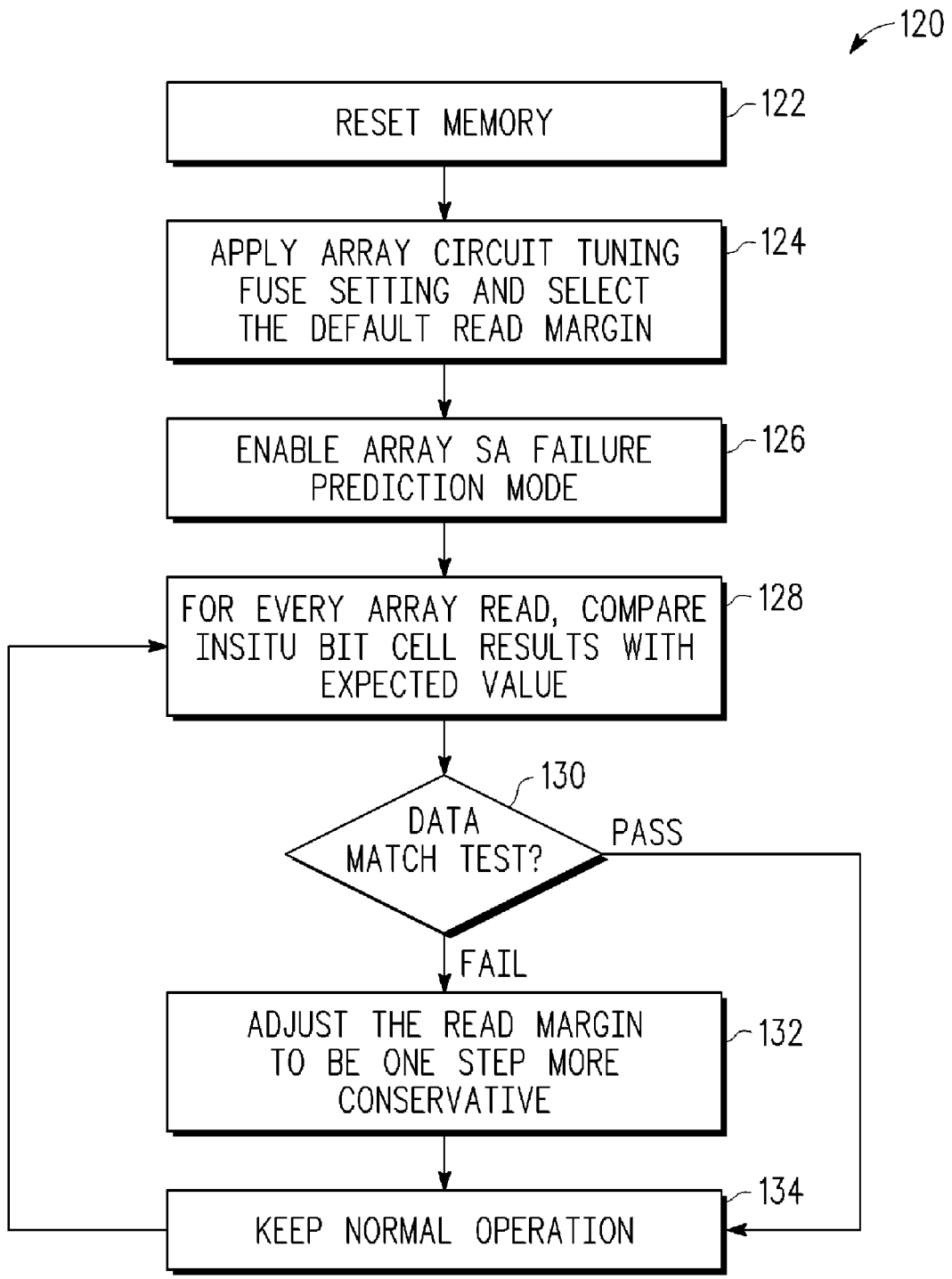
FIG. 5 illustrates a flow chart of a method for determining read margin in accordance with yet another embodiment.

FIG. 5 illustrates a flow chart of method 120 for determining adjusting a read margin in the memory of FIG. 2. At step 122, the memory is reset or initialized. At step 124, array circuit tuning fuse settings are applied and a default read margin is selected from the margin table in service repair logic 74. The fuse settings may include power supply voltage, frequency, and redundancy. At step 126, the service repair logic 74 will assert enable signal ENABLE to sense amplifier control 76 causing shadow sense amplifiers 62 and 64 to operate in a failure prediction mode. At step 128, each time the normal array 12 is read, the memory cells of shadow columns 52 are read and their outputs evaluated to determine if there is a read failure of one or both of shadow sense amplifiers 62 and 64. The details of how shadow sense amplifiers are used to adjust the margins of normal sense amplifiers 54 are discussed above in the discussion of FIG. 2. If one of the shadow sense amplifiers fails, then it is assumed that one of the normal sense amplifiers may be close to failing. At decision step 130, for every read it is determined if the data from shadow columns 52 is what it is suppose to be. If the data matches the control data, then the test passes and the PASS path is taken to step 134 where the current sense amplifier margins are maintained. From step 134 the method returns to step 128 and repeats for as long as the failure prediction mode is enabled. If, at decision step 130 the data from the shadow columns does not match, then the FAIL path is taken to step 132. At step 132, the read margin is adjusted to be one step more conservative by increasing the margin of the normal sense amplifiers and the margin of the shadow sense amplifiers. The normal operation is now resumed at step 134 with the new, more conservative read margin. If the memory is then reset, the previous default read margin will be reloaded as indicated at step 122. This allow for more reliable operation during changing operating conditions while maintaining a performance advantage when the operating conditions are favorable.

Figure 6:
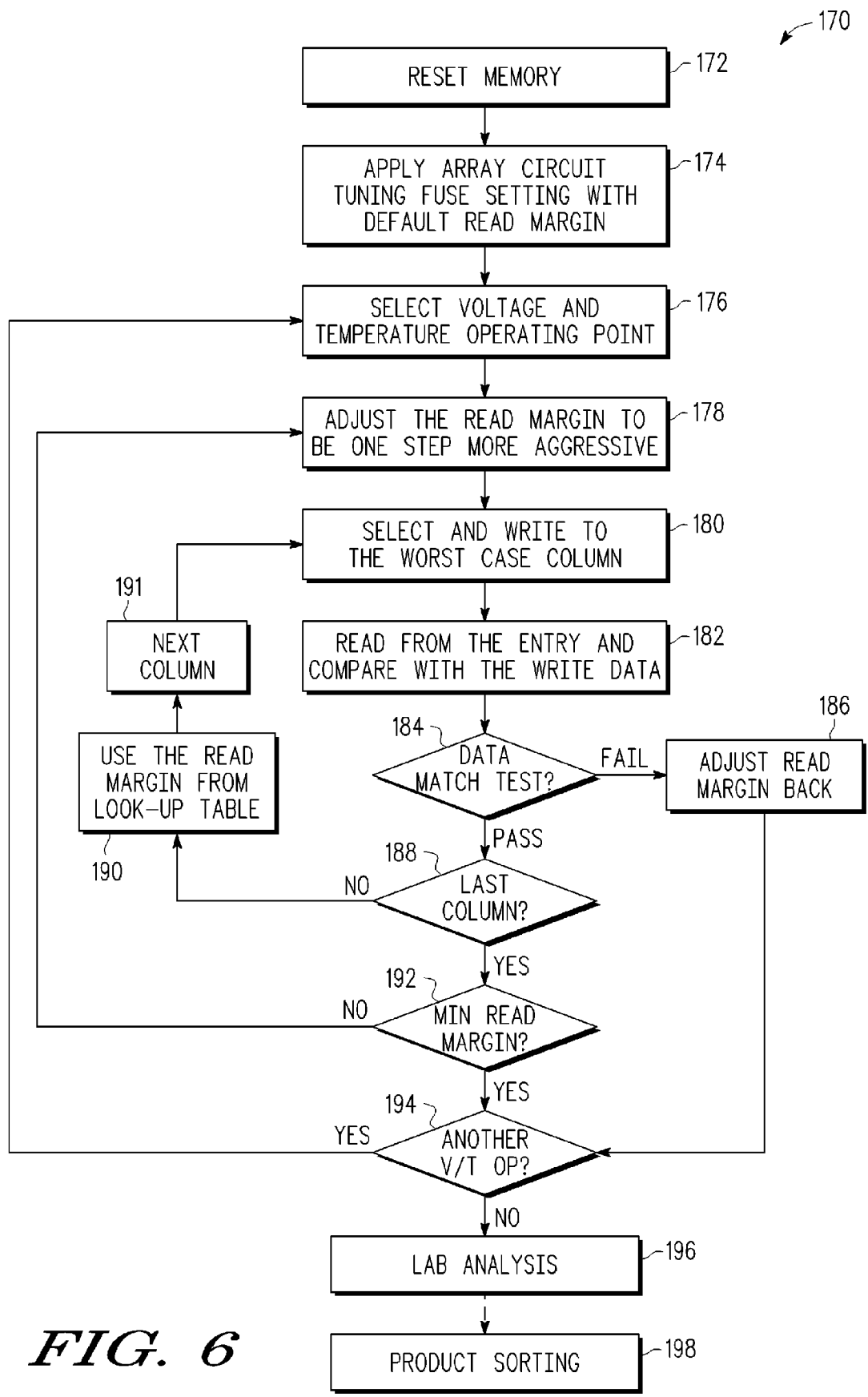
FIG. 6 illustrates a flow chart of a method for determining read margin in accordance with another embodiment.

FIG. 6 illustrates a flow chart of a method 170 for determining an optimum read margin in memory 10 of FIG. 1. Method 170 is used to adjust the read margin of a memory for a performance gain. Prior to beginning method 170, the memory is first tested for reliable operation and redundancy is used, if necessary. At step 172, the operation of memory 10 begins with a reset operation. At step 174, the array 12 circuit tuning fuse setting are applied, such as for example, redundancy, frequency, and default read margin. At step 176, the power supply voltage and temperature are set. At step 178, the read margin is adjusted to be one step more aggressive. This is done by selecting the next lower read margin from the read margin table in service repair logic 28. At step 180, the worst case column is selected and written to. The worst case column may be determined by empirical data. At step 182, the worst case column is read from and compared with the WRITE DATA stored in service repair logic 28. At decision step 184, if the data does not match, the test failed at the new read margin. The FAIL path is taken to step 186 and the read margin is adjusted back the previously set read margin. At decision step 194, the decision is made as to whether or not to test another voltage/temperature. If the decision is NO, then the NO path is taken to steps 196 and 198 for lab analysis and product sorting. If, at decision step 184, the data does match, then the test passed and the PASS path is taken to step 188. At step 188, the NO path is taken to step 190 and the currently set read margin is used to test another column. At step 191, the next column is set and flow returns to step 180. The loop from step 180 to 188 is repeated until a column fails or all of the columns pass the current read margin. Then the flow moves to decision step 192. At decision step 192, it is determined if the minimum read margin from the read margin table has been used. If not, then the NO path is taken back to step 178 where the read margin is readjusted from the table and the method is repeated from step 178. If the minimum read margin has been used, then the YES path is taken to step 194. At step 194, it is determined if the test should be repeated with a different voltage and temperature. If not, then the NO path is taken to steps 196 and 198 for laboratory analysis and product sorting, i.e. binning. If the test is to be repeated with a different voltage and temperature then the YES path is taken back to step 176 where a new voltage and temperature are selected and the method is repeated from step 176.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

By now it should be appreciated that there has been provided, a memory having a dynamically adjustable read margin and method therefor. In one embodiment, the memory and method allow a read margin to be adjusted to improve the reliability of a memory. In another embodiment, the memory and method are used to derive a performance gain.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary memory, this memory is presented merely to provide a useful reference in discussing various aspects of the invention. Of course, the description of the memory has been simplified for purposes of discussion, and it is just one of many different types of appropriate memories that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of memory 10 are circuitry located on a single integrated circuit or within a same device. Alternatively, system 10 may include any number of separate integrated circuits or separate devices interconnected with each other. For example, memory 10 may be embedded on a same integrated circuit as a processor on a separate integrated circuit as a stand-alone memory. Also, the memory array 12 has been described as having SRAM cells. In another embodiment, the memory array may have another type of storage cell, such as for example, a dynamic random access memory (DRAM) cells, or one of the non-volatile memory types such as magnetoelectric random access memory (MRAM) cells, or floating gate memory cells.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for dynamically controlling sense amplifier differential margin of a memory during operation, in an integrated circuit, comprising a plurality of addressable units, the method comprising:
   setting the sense amplifier differential margin corresponding to the plurality of addressable units to a first value; and
   if a read data error occurs when data is read from a set of the plurality of addressable units, then setting the sense amplifier differential margin corresponding to the plurality of addressable units to a second value, wherein the second value is higher than the first value.

2. The method of claim 1, wherein the first value of the sense amplifier differential margin corresponds to a first selected operating point.

3. The method of claim 2, wherein the first selected operating point corresponds to a selected voltage and a selected frequency for operating the integrated circuit.

4. The method of claim 1, wherein the set of plurality of addressable units includes only one addressable unit that has incurred a higher failure rate than any of the remaining plurality of addressable units.

5. The method of claim 1, wherein the memory further comprises a plurality of sense amplifiers coupled to the plurality of addressable units, and wherein setting the sense amplifier differential margin comprises setting a sense amplifier enable assert time of the plurality of sense amplifiers.

6. The method of claim 4 further comprising incrementally setting the sense amplifier differential margin to a higher value than a previous value until a read operation on the addressable unit that has incurred the higher failure rate than any of the remaining plurality of addressable units does not result in a read data error.

7. The method of claim 1 further comprising decrementally setting the sense amplifier differential margin to a set of values starting from a highest possible value of the sense amplifier differential margin to a lowest value of the sense amplifier differential margin and incorporating an analysis of read errors resulting from setting of the sense amplifier differential margin to the set of values in a process of sorting the plurality of integrated circuits into bins based on the read errors.

8. A method for dynamically controlling sense amplifier differential margin of a memory, in an integrated circuit, comprising a plurality of addressable units, the plurality of addressable units comprising at least one failure prediction addressable unit, wherein the failure prediction addressable unit is configured to fail before the remaining plurality of addressable units, the method comprising:
    setting the sense amplifier differential margin corresponding to the plurality of addressable units and the at least one failure prediction addressable unit to a first value; and
    if a read data error occurs when data is read from the failure prediction addressable unit, then setting the sense amplifier differential margin corresponding to the plurality of addressable units to a second value, wherein the second value is greater than the first value.

9. The method of claim 8, wherein the first value of the sense amplifier differential margin corresponds to a first selected operating point.

10. The method of claim 9, wherein the first selected operating point corresponds to a selected voltage and a selected frequency for operating the integrated circuit.

11. The method of claim 8, wherein the memory further comprises a plurality of sense amplifiers coupled to the plurality of addressable units, and wherein setting the sense amplifier differential margin comprises setting a sense amplifier enable assert time of the plurality of sense amplifiers.

12. The method of claim 8 further comprising incrementally setting the sense amplifier differential margin to a higher value than a previous value until a read operation on the failure prediction addressable unit does not result in a read data error.

13. A method for dynamically controlling sense amplifier differential margin of a memory, in an integrated circuit, comprising a plurality of addressable units and at least one redundant addressable unit, the method comprising:
    setting the sense amplifier differential margin corresponding to the plurality of addressable units and the at least one redundant addressable unit to a first value; and
    if a read data error occurs when data is read from any one of the plurality of addressable units, then setting the sense amplifier differential margin corresponding to the plurality of addressable units and the at least one redundant addressable unit to a second value, wherein the second value is greater than the first value;
    incrementally increasing the sense amplifier differential margin to a maximum value if a read data error continues to occur for any one of the plurality of addressable units; and
    substituting the redundant addressable unit in place of a defective addressable unit, wherein the defective addressable unit is one of the plurality of addressable units that generates a read data error even when the sense amplifier differential margin is set to the maximum value.

14. The method of claim 13, wherein the first value of the sense amplifier differential margin corresponds to a first selected operating point.

15. The method of claim 14, wherein the first selected operating point corresponds to a selected voltage and a selected frequency for operating the integrated circuit.

16. The method of claim 13, wherein the memory further comprises a plurality of sense amplifiers coupled to the plurality of addressable units and the redundant addressable unit, and wherein setting the sense amplifier differential margin comprises setting a sense amplifier enable assert time of the plurality of sense amplifiers and the redundant addressable unit.

17. An integrated circuit comprising a memory, wherein the memory comprises a plurality of addressable units, the memory further comprising:
    a memory array coupled to a plurality of sense amplifiers; and
    a feedback path configured for:
        setting a sense amplifier differential margin for the plurality of sense amplifiers to a first value,
        detecting a read data error when data is read from at least one of the plurality of addressable units, and
        setting the sense amplifier differential margin for the plurality of addressable units to a second value, wherein the second value is greater than the first value.

18. The integrated circuit of claim 17, wherein the first value of the sense amplifier differential margin corresponds to a first selected operating point.

19. The integrated circuit of claim 17, wherein the first selected operating point corresponds to a selected voltage and a selected frequency for operating the integrated circuit.

20. The integrated circuit of claim 17, wherein the feedback path comprises an error detector for detecting the read data error.

21. The integrated circuit of claim 17, wherein the feedback path is further configured for incrementally setting the sense amplifier differential margin to a higher value than a previous value until a read operation on an addressable unit that has incurred a higher failure rate than any of the remaining plurality of addressable units does not result in a read data error.

* * * * *